United States Patent
James-Roxby et al.

(10) Patent No.: US 11,216,275 B1
(45) Date of Patent: Jan. 4, 2022

(54) CONVERTING FLOATING POINT DATA INTO INTEGER DATA USING A DYNAMICALLY ADJUSTED SCALE FACTOR

(71) Applicant: XILINX, INC., San Jose, CA (US)

(72) Inventors: Philip B. James-Roxby, Longmont, CO (US); Eric F. Dellinger, Longmont, CO (US)

(73) Assignee: XILINX, INC., San Jose, CA (US)

(*) Notice: Subject to any disclaimer, the term of this patent is extended or adjusted under 35 U.S.C. 154(b) by 160 days.

(21) Appl. No.: 16/531,971

(22) Filed: Aug. 5, 2019

(51) Int. Cl.
| | |
|---|---|
| G06F 9/30 | (2018.01) |
| G06F 7/499 | (2006.01) |
| G06F 5/01 | (2006.01) |
| G06F 7/483 | (2006.01) |
| H03M 7/24 | (2006.01) |

(52) U.S. Cl.
CPC .......... *G06F 9/30025* (2013.01); *G06F 5/012* (2013.01); *G06F 7/483* (2013.01); *G06F 7/49915* (2013.01); *G06F 9/30014* (2013.01); *G06F 9/30105* (2013.01); *H03M 7/24* (2013.01); *G06F 2207/4824* (2013.01)

(58) Field of Classification Search
CPC ............. G06F 9/30025; G06F 9/30014; G06F 9/30105; G06F 5/012; G06F 7/483; G06F 7/39915
See application file for complete search history.

(56) References Cited

U.S. PATENT DOCUMENTS

| | | | | | |
|---|---|---|---|---|---|
| 5,257,215 | A | * | 10/1993 | Poon | H03M 7/24 708/204 |
| 5,764,548 | A | * | 6/1998 | Keith | H03M 7/24 708/204 |
| 2002/0184282 | A1 | * | 12/2002 | Yuval | G06F 9/30025 708/495 |
| 2013/0262539 | A1 | * | 10/2013 | Wegener | G06F 7/483 708/204 |
| 2015/0095387 | A1 | * | 4/2015 | Lagneau | H03M 7/02 708/204 |
| 2016/0211862 | A1 | * | 7/2016 | Ho | H03M 7/04 |
| 2019/0079762 | A1 | | 3/2019 | Heinecke et al. | |
| 2019/0087718 | A1 | | 3/2019 | Martin et al. | |
| 2019/0196818 | A1 | | 6/2019 | Madduri et al. | |

* cited by examiner

*Primary Examiner* — Michael D. Yaary
(74) *Attorney, Agent, or Firm* — Patterson + Sheridan, LLP

(57) ABSTRACT

The embodiments herein describe a conversion engine that converts floating point data into integer data using a dynamic scaling factor. To select the scaling factor, the conversion engine compares a default (or initial) scaling factor value to an exponent portion of the floating point value to determine a shift value with which to bit shift a mantissa of the floating point value. After bit shifting the mantissa, the conversion engine determines whether the shift value caused an overflow or an underflow and whether that overflow or underflow violates a predefined policy. If the policy is violated, the conversion engine adjusts the scaling factor and restarts the conversion process. In this manner, the conversion engine can adjust the scaling factor until identifying a scaling factor that converts all the floating point values in the batch without violating the policy.

20 Claims, 5 Drawing Sheets

COMPUTING SYSTEM
100

CONVERTING FLOATING POINT DATA INTO INTEGER DATA USING A DYNAMICALLY ADJUSTED SCALE FACTOR

TECHNICAL FIELD

Examples of the present disclosure generally relate to converting floating point data into integer data using an adjustable scaling factor.

BACKGROUND

Integer arithmetic is performed in many different hardware platforms. Often, the data is presented as floating point values. This means the computing system must convert the floating point values into integer values. This conversion is typically performed using a scale factor but it can be difficult to pick a good scale factor for floating point values when the computing system does not know the distribution of the values. For example, too large of a scale factor may result in a loss of precision when converting smaller numbers, while too small of a scale factor may wash out larger numbers.

SUMMARY

Techniques for converting a floating point value into an integer value are described. One example is a conversion engine that includes a comparison circuit configured to compare a scaling factor to an exponent portion of the floating point value to generate a shift value, a shifter configured to change a mantissa portion of the floating point value based on the shift value to generate the integer value, a detector configured to detect one of an underflow and overflow resulting from changing the mantissa portion, a policy enforcer circuit configured to determine whether the underflow or overflow violates a policy, and an adjuster circuit configured to adjust the scaling factor when the policy is violated.

One example described herein is a method that includes comparing a scaling factor to an exponent portion of a floating point value to generate a shift value, bit shifting a mantissa portion of the floating point value based on the shift value to generate an integer value, detecting one of an underflow and overflow resulting from bit shifting the mantissa portion, determining whether the underflow or overflow violated a policy, and adjusting the scaling factor in response to the policy being violated.

One example described herein is a computing system that includes a first hardware element configured to output a batch of floating point values and a conversion engine. The conversion engine is configured to compare a scaling factor to respective exponent portions of the floating point values to generate respective shift values, change mantissa portions of the floating point values based on the respective shift values to generate integer values, detect one of an underflow and overflow resulting from changing the mantissa portions, determine whether the underflow or overflow violated a policy, and adjust the scaling factor in response to the policy being violated. The computing system further includes a memory configured to store the integer values received from the conversion engine.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

DETAILED DESCRIPTION

Figure 1:
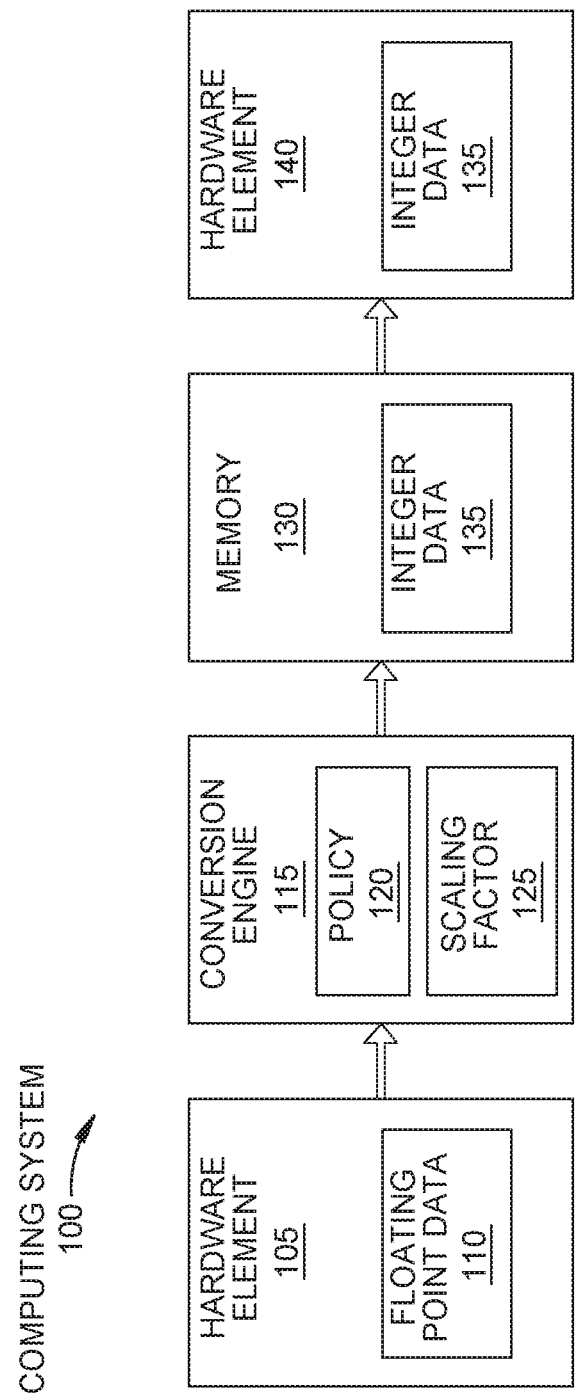
FIG. 1 is a block diagram of a computing system that uses a policy to adjust a scaling factor when converting floating point data to integer data, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

The embodiments herein describe a conversion engine that receives floating point data from a first hardware element, converts the floating point data into integer data, and stores the integer data in a memory. The integer data can then be consumed by a second hardware element that performs integer arithmetic. However, selecting a common scaling factor to use for converting a batch of floating point values to corresponding integer values is difficult. The conversion engine may not know the distribution of the floating point values (are they mainly large values, small values, small/large standard deviation, and the like).

To select the scaling factor, the conversion engine uses a predefined policy to adjust the scaling factor to achieve a desired result. In one embodiment, the conversion engine compares a default (or initial) scaling factor value to an exponent portion of the floating point value to determine a shift value with which to bit shift the remaining portion of the floating point value (referred to as the mantissa, significand, or coefficient). After bit shifting the mantissa, the conversion engine determines whether the shift value caused an overflow or an underflow where the resulting integer value lost precision. If so, the conversion engine determines whether the overflow or underflow violates the policy. For example, the policy may indicate that there cannot be any overflow when converting the floating point values, or that there can be at most five underflows. If the policy is violated, the conversion engine adjusts the scaling factor (e.g., increases the scaling factor to mitigate the likelihood of overflows and decreases the scaling factor to mitigate the likelihood of underflows) and restarts the conversion process. In this manner, the conversion engine can adjust the scaling factor until identifying a scaling factor that converts all the floating point values in the batch without violating the policy. The resulting integer values are then stored in memory, ready to be processed using integer arithmetic.

FIG. 1 is a block diagram of a computing system 100 that uses a policy to adjust a scaling factor when converting floating point data to integer data, according to an example. The system 100 includes a hardware element 105 which outputs floating point data 110 that includes a plurality of floating point values. For example, the hardware element 105 may be a floating point arithmetic unit which generates the floating point data. In another embodiment, the hardware element 105 may be memory (e.g., cache memory) used to store the floating point data 110 for an upstream hardware element (e.g., a processor).

In one embodiment, the hardware element 105 outputs the floating point data 110 in a batch to a conversion engine 115 that converts the floating point values in the data 110 into corresponding integer values which are stored in a memory 130 as integer data 135. To perform this conversion, the conversion engine 115 includes a policy 120 and a scaling factor 125. As described in more detail below, the policy 120 provides thresholds or criteria that the conversion engine 115 can use to determine whether to adjust the scaling factor 125 used to convert the floating point data 110 into the integer data 135. In one embodiment, the policy 120 evaluates the number of times converting the floating point data 110 using the scaling factor 125 results in an underflow or overflow where precision is lost. If the policy 120 is violated, the conversion engine 115 adjusts the scaling factor 125 and then restarts the conversion process.

In one embodiment, the conversion engine 115 is a hardware element. The conversion engine 115 may be incorporated into the hardware element 105, the memory 130, or may be a separate hardware unit. Moreover, the conversion engine 115 may also include firmware that can be used to adjust the scaling factor 125.

After conversion is complete, a hardware element 140 can retrieve the integer data 135 from the memory 130 and perform integer arithmetic. The hardware element 140 can be disposed in the same computing device as the hardware element 105, the conversion engine 115, and the memory 130, or these elements may be disposed on different devices that are communicatively coupled using, e.g., a cable or a wireless connection. For example, the hardware element 105 and the conversion engine 115 may be disposed on one computing device while the memory 130 and the hardware element 140 are disposed on a different computing device.

Figure 2:
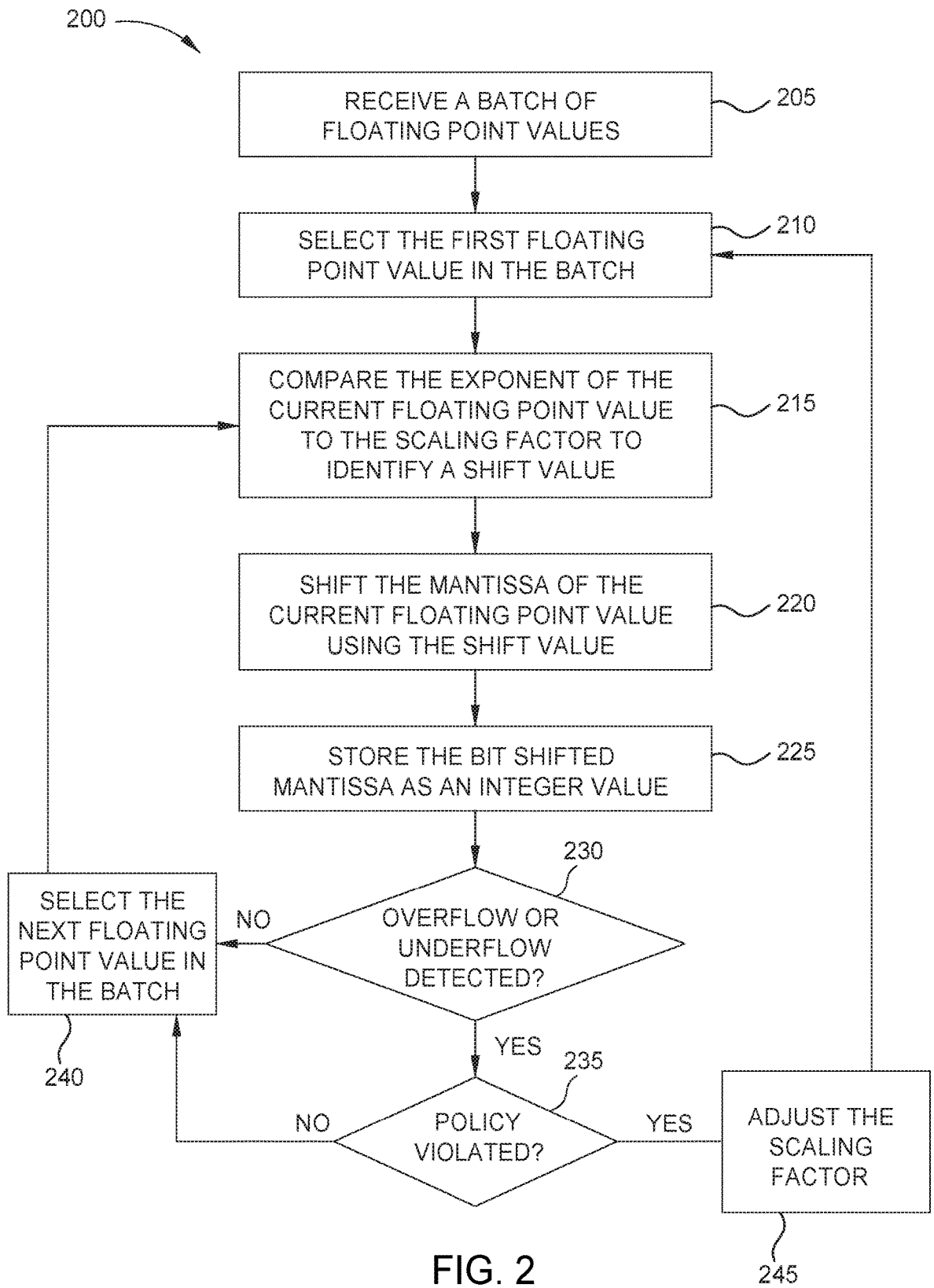
FIG. 2 is a flowchart for adjusting a scaling factor when converting floating point data to integer data, according to an example.

FIG. 2 is a flowchart of a method 200 for adjusting a scaling factor when converting floating point data to integer data, according to an example. For clarity, the blocks in the method 200 are discussed in tandem with FIG. 3 which illustrates a hardware design that adjusts a scaling factor when converting floating point data to integer data.

Figure 3:
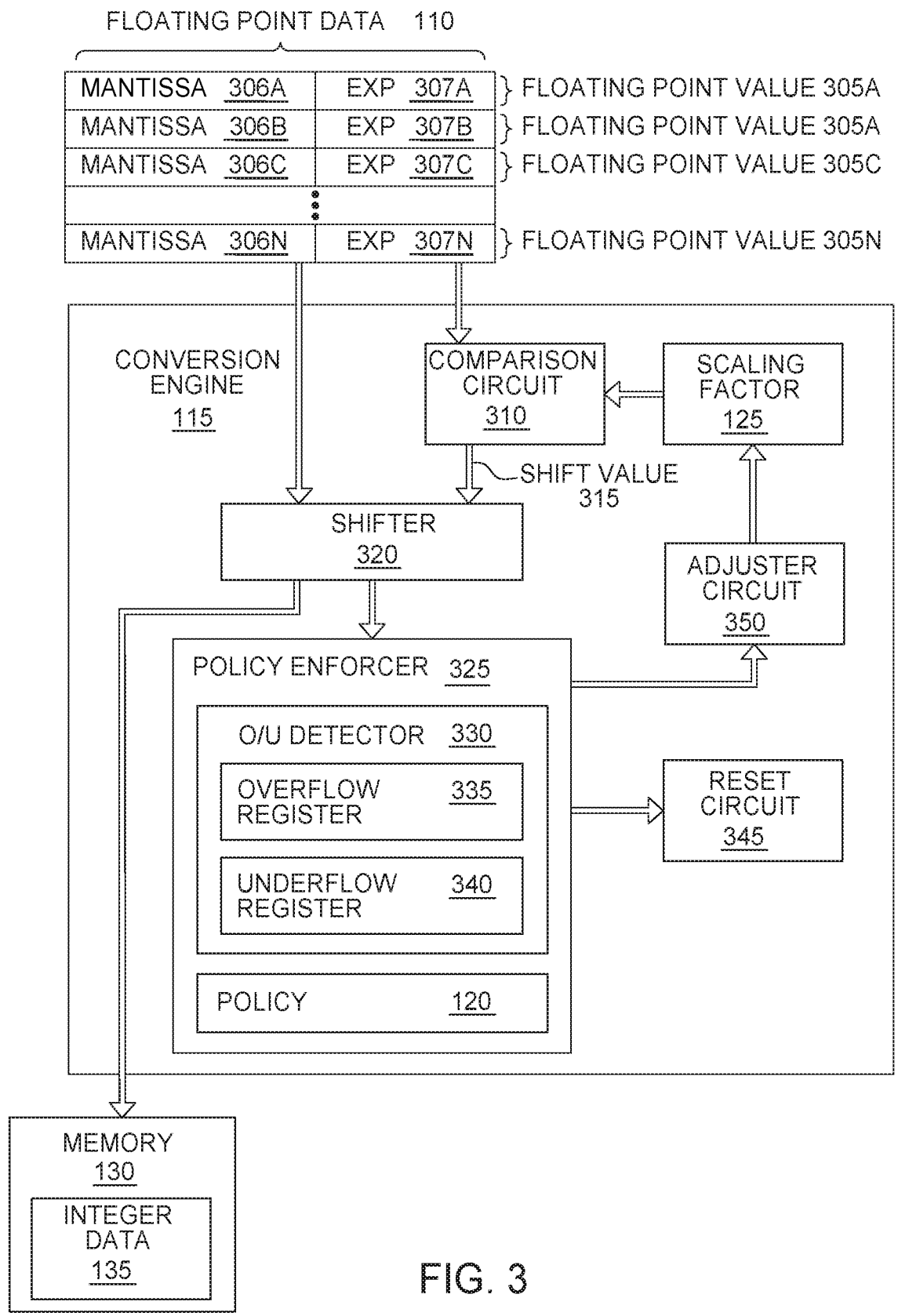
FIG. 3 is a hardware design that adjusts a scaling factor when converting floating point data to integer data, according to an example.

At block 205, the conversion engine 115 receives a batch of floating point values 305 to be converted into corresponding integer values. As shown in FIG. 3, the floating point data 110 include multiple floating point values 305 (e.g., a batch) where a first portion of the bits in the floating point values 305 define a mantissa 306 (or significand) while a second portion of the bits define an exponent (EXP) 307 for scaling the mantissa 306. The number of bits in the mantissa 306 and the exponent 307 can vary depending on the implementation. The embodiments herein can be used regardless of the manner in which the bits in the floating point values 305 are allocated.

At block 210, the conversion engine selects the first floating point value in the batch of floating point data 110—e.g., the floating point value 305A. However, the order in which the conversion engine converts the floating point data 110 does not matter. The conversion engine 115 can start at the beginning, end, or middle of the batch of floating point data 110.

At block 215, a comparison circuit 310 in the conversion engine 115 compares the exponent of the current floating point value (e.g., the exponent 307A of the value 305A) to the scaling factor 125 to identify a shift value 315. In one embodiment, when receiving a new batch of floating point values 305, the conversion engine 115 may set the scaling factor 125 (which is stored in a register in the engine 115) to a default or initial value. The comparison circuit 310 then compares the default scaling factor 125 to the exponent 307 of the first floating point value 305 in the batch. For example, if the scaling factor is $2^{-8}$ and the exponent 307 is $2^{-3}$, the comparison circuit 310 determines a shift value 315 of 5 in a first direction (e.g., a left shift). However, if the scaling factor is $2^{-8}$ and the exponent 307 is $2^{-9}$, then the shift value 315 is 1 in a second direction (e.g., a right shift). Stated differently, if the value of the scaling factor 125 is smaller than the exponent 307, the shift value 315 is in a first direction (e.g., a left shift or positive direction) but if the scaling factor 125 is larger than the exponent, the shift value 315 is in a second direction (e.g., a right shift or negative direction).

At block 220, a shifter 320 in the conversion engine 115 shifts the mantissa of the current floating point value (e.g., the mantissa 306A of the floating point value 305A) using the shift value 315. For example, if the scaling factor is $2^{-8}$ and the floating point value is $1.0110111100111010100001000*2^{-3}$, the shift value 315 is a left shift of 5 which shifts the bits of the mantissa 306 to 00101101.111 . . . . Depending on the rounding mode, the lower bits (i.e., the bits to the right of the point) are either truncated or rounded to form the integer value. For example, if the integer value is 8-bits, the shifter 320 outputs the sign bit and the first seven bits of the mantissa (e.g., the seven most significant bits of the mantissa) while the remaining bits in the floating point value (which includes any remaining (lower) bits in the mantissa and all the bits in the exponent 307) are dropped.

In another example, if the scaling factor is $2^{-8}$ and the floating point value is $1.101001011110001010101010*2^{-12}$, the shift value 315 is a right shift of 4 which shifts the bits of the mantissa 306 to 00000000.0001101 . . . . Depending on the rounding mode, the lower bits (i.e., the bits to the right of the decimal) are either truncated or rounded to form the integer value, which is $000000*2^{-8}=0$. Thus, the number is too small to represent using the current scaling factor, which results in an underflow.

In another example, if the scaling factor is $2^{-8}$ and the floating point value is $1.1011011000000000101110*2^{0}$, the shift value 315 is to the left by 8 which shifts the bits of the mantissa 306 to 110110110.00000 . . . . This is an overflow since there are too many bits to the left of the point (assuming the integer values are limited to 8-bits). In that case, $11111111=255*2^{-8}=0.9961$ is the largest number that can be represented with the current scale factor.

In one embodiment, the shifter 320 outputs a binary integer value that has less bits than the bits used to represent the floating point values 305. For example, the shifter 320 may output an eight bit integer value (i.e., the first eight bits of the mantissa 306 after it has been shifted by the shift value 315) for each 32-bit floating point value 305. In this manner, the conversion engine 115 can use the scaling factor 125 to convert an X-bit floating point value 305 to a Y-bit integer value (where in one embodiment Y is less than X). Further, the mantissa 306 may have more bits than the integer value. Thus, even if the mantissa 306 is not shifted, the shifter 320 may drop bits to form the integer value. For example, the mantissa 306 may be assigned 16 bits of a 32-bit floating point value, but the shifter 320 outputs only an 8-bit integer value. However, in other embodiments, the bits of the integer value output by the shifter 320 may be equal to or greater than the bits of the mantissa 306.

At block 225, the shifter 320 stores the bit shifted mantissa as an integer value. In FIG. 3, the output of the shifter 320 is coupled to the memory 130 which stores the converted integer value in the integer data 135.

At block 230, a policy enforcer 325 in the conversion engine 115 determines whether there was an overflow or an underflow when shifting the bits of the mantissa at block 220. Specifically, the policy enforcer 325 includes an overflow/underflow (O/U) detector 330 which determines when an overflow or underflow occurs. In one embodiment, the O/U detector 330 determines an underflow occurs when a shift value 315 in the right direction causes the resulting integer value to be all zeros. For example, if the shift value 315 ever exceeds the number of bits in the integer value when performing a right shift, then shifting the mantissa using the shift value 315 results in an integer value that is all zeros. This indicates that the scaling factor 125 is too large and lacks the ability to accurately convert the relatively smaller floating point value 305.

Conversely, the O/U detector determines an overflow occurs when a shift value 315 in the left direction results with more bits to the left of the point than can be represented in the 8-bit integer value—e.g., 110110110.00000 which has nine bits to the left of the point but the integer value is limited to less than nine bits.

Assuming there was no underflow or overflow detected, the method 200 proceeds to block 240 where the conversion engine 115 selects the next floating point value 305 in the batch of floating point data 110. The method 200 then returns to block 215 and repeats. In this manner, the method 200 can evaluate the floating point values 305 to determine whether converting the values 305 to corresponding integer values results in an underflow or overflow.

Assuming the O/U detector 330 did detect an underflow or overflow at block 230 when converting the mantissa into an integer value, the detector 330 can update one of an overflow register 335 or the underflow register 340. In one embodiment, the overflow register 335 maintains a count of how many overflows occurred when converting the current batch of floating point data 110. The underflow register 340 maintains a count of how many underflows occurred when converting the same batch of floating point data 110.

If an underflow or overflow is detected, the method 200 proceeds to block 235 where the policy enforcer 325 determines whether the policy 120 is violated as a result of the underflow or overflow. For example, the policy 120 may indicate that when converting the batch of floating point data 110, there can be at most five overflows. If, when repeating method 200, the overflow register 335 reaches a count of six, at block 235, the policy enforcer 325 determines the policy 120 was violated. However, if an overflow occurs but the count in the overflow register 335 is five or less, then the policy enforcer 325 determines the policy 120 was not violated.

The particular criteria or threshold defined by the policy 120 can vary depending on the application or implementation. For example, if the larger numbers need to be accurately represented, the policy 120 may dictate a maximum number of overflows that can occur. If the smaller numbers are more important, the policy 120 may dictate a maximum number of underflows that can occur. Moreover, the policy 120 could provide desired thresholds for both underflows and overflows, but this might lead to a situation where no scaling factor satisfies the thresholds defined in the policy 120 (e.g., the conversion engine 115 is unable to convert the entire batch without violating the policy 120). In any case, the policy 120 can change depending on the hardware block that is relying on the conversion engine 115 to convert floating point data to integer data. For example, the conversion engine 115 may use a first policy 120 when converting floating point data between a first pair of hardware elements, but a second policy 120 (with a different threshold or criteria) when converting floating point data between a second pair of hardware elements. These multiple policies may be pre-loaded into the conversion engine 115 or the policies may be swapped out when the conversion engine 115 is communicatively coupled to different hardware elements.

If the policy 120 was not violated by the underflow or overflow at block 235, the method 200 proceeds to block 240 where the next floating point value is selected and converted to an integer value by repeating blocks 215-225. However, if the policy was violated, the method 200 proceeds to block 245 where an adjuster circuit 350 in the conversion engine 115 changes the value of the scaling factor. For example, if the scaling factor is too large (and caused an underflow event that violated the policy), the adjuster circuit 350 reduces the scaling factor 125. If the scaling factor is too small (and caused an overflow event that violated the policy), the adjuster circuit 350 increases the scaling factor 125.

In one embodiment, the adjuster circuit 350 scales the scaling factor 125 at predefined intervals. For example, each time the policy 120 is violated when converting the batch, the scaling factor 125 is increased or decreased by a power of two. Alternatively, the adjuster circuit 350 may make larger adjustments when the policy 120 is first violated (based on the assumption that the initial or default scaling factor 125 is more likely to be off than when the adjuster circuit 350 starts to change the scaling factor 125), but then reduce the size of the adjustments when the policy 120 is violated during later iterations. Additional techniques to adjusting the scaling factor 125 are described below.

In addition to adjusting the scaling factor, at block 245, the conversion engine 115 can use a reset circuit 345 to reset the conversion engine 115 to begin again to convert the current batch of floating point data 110 into the integer data 135. For example, the reset circuit 345 may reset the overflow and underflow registers 335 and 340 so their count is back to zero. The reset circuit 345 may reset an address or index value used to read the floating point values 305 so that the conversion engine 115 again reads the first value in the batch—e.g., the floating point value 305A. The method 200 then returns to block 210 where the conversion engine 115 selects the first floating point value and the rest of the method 200 repeats but this time using the updated scaling factor 125 to convert the floating point values 305 into integer values. Put differently, each time the policy is violated when converting a batch of floating point values, the conversion engine 115 adjusts the scaling factor 125 and then re-converts that same batch of floating point values 305.

If the policy 120 is again violated, the conversion engine 115 adjusts the scaling factor 125 again and then attempts to re-convert the same batch of floating point values 305. This repeats until the conversion engine 115 identifies a scaling factor 125 that permits it to convert all of the floating point values 305 in the batch without violating the policy 120.

Each time the policy is violated and the conversion engine 115 begins the conversion process again, the integer data 135 may be overwritten. For example, initially, the conversion engine 115 may convert only half of the floating point values 305 into integer values, which are stored as the integer data 135 in the memory 130. After adjusting the scaling factor 125, the conversion engine 115 may convert two-thirds of the floating point values 305 into integer values that overwrite the previously written integer data 135. This can continue until eventually the entire batch of floating point values are written into the memory 130.

In one embodiment, the conversion engine 115 may set a flag in the memory 130 when it has successfully converted the entire batch of floating point values 305 into integer values. This indicates to the downstream hardware element (which wants to perform integer arithmetic on the integer data 135) that the conversion process is complete and the hardware element can retrieve the integer data 135 from memory. In another embodiment, the downstream hardware element waits for a prompt or doorbell from the conversion engine 115 that indicates the conversion process is complete and the integer data 135 can be retrieved from the memory 130.

Figure 4:
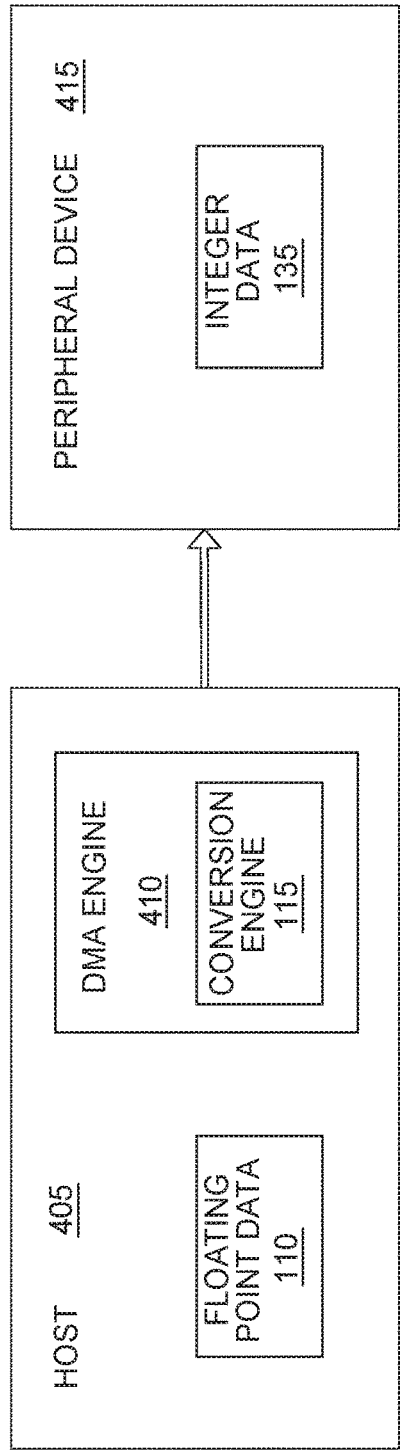
FIG. 4 is a block diagram of a computing system that converts floating point data to integer data using a conversion engine, according to an example.

FIG. 4 is a block diagram of a computing system 400 that converts floating point data to integer data using a conversion engine, according to an example. The system 400 includes a host 405 communicatively coupled to a peripheral device 415. The host 405, for example, can be a server or a virtual machine. The host 405 can be a standalone computing device or may be part of a database such as a cloud computing service.

The host 405 includes the floating point data 110 and a direct memory access (DMA) engine 410 that performs read and writes to the peripheral device 415. In this case, the DMA engine 410 is modified to include the conversion engine 115. The conversion engine 115 can perform the method 200 above to convert the floating point data 110 into the integer data 135 which is then transmitted (using DMA) to the peripheral device 415. The integer data 135 is then stored in memory in the peripheral device 415.

The peripheral device 415 can include any input/output (I/O) peripheral device such as a graphics processing unit, field programmable gate array (FPGA), or hardware accelerator—e.g., a cryptographic accelerator, compression accelerator, machine learning (ML) accelerator, and the like. As a non-limiting example, the peripheral device 415 may execute a ML application where the floating point data 110 are the weights used when processing a particular layer in a neural network. Instead of storing (and processing) floating point values, the peripheral device 415 can receive the converted integer data 135 from the conversion engine 115.

Figure 5:
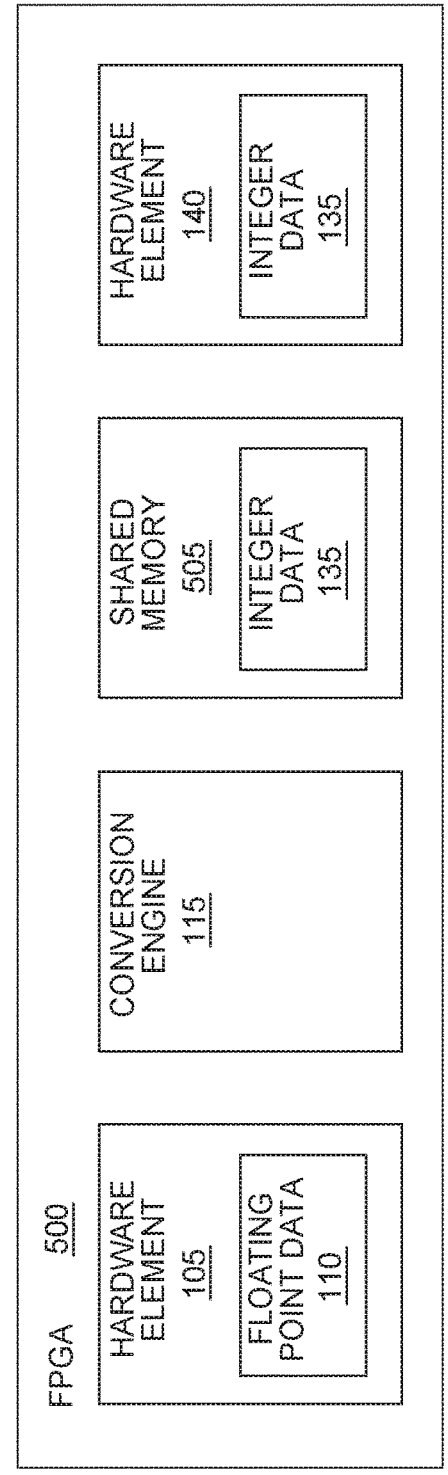
FIG. 5 is a block diagram of a computing system that converts floating point data to integer data using a conversion engine, according to an example.

FIG. 5 is a block diagram of an FPGA 500 that converts floating point data to integer data using a conversion engine, according to an example. Unlike in FIG. 4 where the conversion engine 115 converts floating point data to integer data which is shared between different computing devices, in FIG. 5 the conversion engine 115 converts data that is shared between two different hardware elements in the same computing device (e.g., the FPGA 500).

As shown, the FPGA 500 includes the hardware element 105 which generates or stores the floating point data 110. The hardware element 105 transmits the floating point data 110 to the conversion engine 115 which can perform the method 200 to convert the data 110 into integer data 135. The integer data 135 is stored in the shared memory 505 which is shared by the hardware element 105 and the hardware element 140. That is, the shared memory 505 is accessible by both hardware elements 105, 140. Once the conversion process is complete, the hardware element 140 can retrieve the integer data 135 from the shared memory 505 and perform integer arithmetic on the integer data 135. For example, the integer arithmetic may be part of a ML, cryptographic, compression, or other accelerator application.

Figure 6:
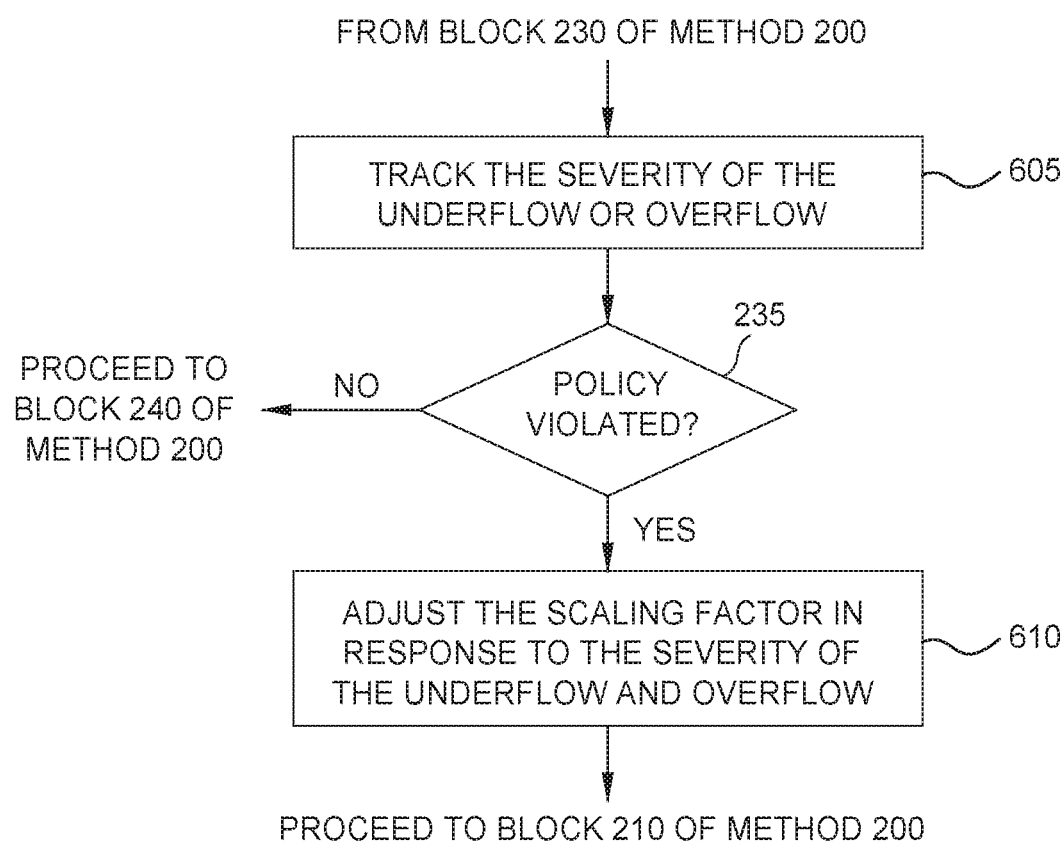
FIG. 6 is a flowchart for adjusting the scaling factor, according to an example.

FIG. 6 is a flowchart of a method 600 for adjusting the scaling factor, according to an example. The method 600 begins after block 230 of the method 200 where an underflow or overflow was detected after converting a floating point value into an integer value. At block 605, the conversion engine tracks the severity of the underflow or overflow that occurred. For example, the conversion engine determines the difference between the current scaling factor and the exponent of the floating point value. The severity of the underflow or overflow increases as the difference between the scaling factor and the exponent increases.

In one embodiment, the conversion engine tracks the severity of each of the overflows and underflows that occurs when converting a batch of floating point values. That is, in addition to maintaining a count of the underflows and overflows, the conversion engine can save an indicator of the severity of the underflows and overflows.

At block 235, the policy enforcer in the conversion engine determines whether the policy was violated. The policy enforcer can use the same techniques as described in the method 200, and thus, this block is not described in detail here.

If the policy is not violated, the method 600 proceeds to block 240 of method 200 where the conversion engine converts the next floating point value in the batch to an integer value. However, if the policy is violated, the method 600 proceeds to block 610 where the adjuster circuit adjusts the scaling factor in response to the severity of the underflow and overflow identified at block 605. For example, if the severity was minor for the overflow(s) and/or underflow(s) (e.g., the difference between the scaling factor and the exponent of the floating point value(s) was small), the adjuster circuit may make a small adjustment to the scaling factor. However, if the severity was large, the adjuster circuit may make a larger adjustment to the scaling factor.

Performing the method 600 may reduce the time used by the conversion engine to identify a scaling factor that satisfies the policy for converting the floating point values to integer values. For example, intelligently adjusting the scaling factor in response to the severity of the underflows and overflows can result in the conversion engine having to restart the conversion process less often for a batch of the floating point data.

Once the scaling factor is adjusted, the method 600 proceeds to block 210 of the method 200 where the conversion engine repeats the conversion process for the batch using the newly adjusted scaling factor.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A conversion engine for converting a floating point value into an integer value, comprising:
   a comparison circuit configured to compare a scaling factor to an exponent portion of the floating point value to generate a shift value;
   a shifter configured to change a mantissa portion of the floating point value based on the shift value to generate the integer value;
   a detector configured to detect one of an underflow and overflow resulting from changing the mantissa portion;
   a policy enforcer circuit configured to determine whether the underflow or overflow violates a policy; and
   an adjuster circuit configured to adjust the scaling factor when the policy is violated.

2. The conversion engine of claim 1, wherein the floating point value is part of a batch of floating point values, wherein the conversion engine is configured to convert the batch of floating point values using the scaling factor, wherein the conversion engine further comprises:
   a reset circuit configured to reset the conversion engine when the policy is violated such that the conversion engine begins to reconvert the batch of floating point values to corresponding integer values.

3. The conversion engine of claim 2, wherein converting the batch of floating point values to the corresponding integer values is complete when each of the floating points values is converted without violating the policy.

4. The conversion engine of claim 2, further comprising:
   an overflow register configured to count a number of overflows when converting the batch of floating point values; and
   an underflow register configured to count a number of underflows when converting the batch of floating point values, wherein the reset circuit is configured to reset the overflow and underflow registers when the policy is violated.

5. The conversion engine of claim 1, wherein the policy comprises a threshold indicating a maximum number of one of overflows and underflows that can be detected before the policy is violated.

6. The conversion engine of claim 1, wherein the shift value indicates a number of bits to shift the mantissa portion.

7. The conversion engine of claim 1, wherein the adjuster circuit is configured to adjust the scaling factor based on a severity of one of the underflow and overflow, wherein the severity is based on a difference between the scaling factor and the exponent portion of the floating point value.

8. A method, comprising:
   comparing a scaling factor to an exponent portion of a floating point value to generate a shift value;
   bit shifting a mantissa portion of the floating point value based on the shift value to generate an integer value;
   detecting one of an underflow and overflow resulting from bit shifting the mantissa portion;
   determining whether the underflow or overflow violated a policy; and
   adjusting the scaling factor in response to the policy being violated.

9. The method of claim 8, further comprising:
   performing a reset in response to the policy being violated; and
   reconverting the floating point value into the integer value using the adjusted scaling factor.

10. The method of claim 8, wherein the floating point value is part of a batch of floating point values, further comprising:
    converting each of the floating point values in the batch until the policy is violated; and
    reconverting each of the floating point values in the batch using the adjusted scaling factor.

11. The method of claim 10, further comprising:
    determining that each of the floating point values in the batch was converted to corresponding integer values without violating the policy, wherein each of the floating point values was converted using a same scaling factor.

12. The method of claim 10, further comprising:
    incrementing a count each time an underflow or overflow occurs when converting each of the floating point values.

13. The method of claim 8, wherein the policy comprises a threshold indicating a maximum number of one of overflows and underflows that can be detected before the policy is violated.

14. The method of claim 8, further comprising:
    adjusting the scaling factor based on a severity of one of the underflow and overflow, wherein the severity is based on a difference between the scaling factor and the exponent portion of the floating point value.

15. A computing system, comprising:
    a first hardware element configured to output a batch of floating point values;
    a conversion engine configured to:
       compare a scaling factor to respective exponent portions of the floating point values to generate respective shift values,
       change mantissa portions of the floating point values based on the respective shift values to generate integer values,
       detect one of an underflow and overflow resulting from changing the mantissa portions,
       determine whether the underflow or overflow violated a policy, and
       adjust the scaling factor in response to the policy being violated; and
    a memory configured to store the integer values received from the conversion engine.

16. The computing system of claim 15, wherein the conversion engine is configured to:
    perform a reset in response to the policy being violated; and
    reconvert the floating point values into the integer values using the adjusted scaling factor.

17. The computing system of claim 15, wherein the conversion engine is configured to:
    convert each of the floating point values in the batch into the integer values until the policy is violated.

18. The computing system of claim 15, wherein the conversion engine is configured to:
    determine that each of the floating point values in the batch was converted to the integer values without violating the policy, wherein each of the floating point values was converted using a same scaling factor.

19. The computing system of claim 15, wherein the conversion engine is configured to:
    increment a count each time an underflow or overflow occurs when converting each of the floating point values.

20. The computing system of claim 15, wherein the policy comprises a threshold indicating a maximum number of one of overflows and underflows that can be detected before the policy is violated.

* * * * *